United States Patent [19]

Takikawa et al.

[11] Patent Number: 5,148,245
[45] Date of Patent: Sep. 15, 1992

[54] SEMICONDUCTOR DEVICE HAVING A SELECTIVELY DOPED HETEROSTRUCTURE

[75] Inventors: Masahiko Takikawa, Yokohama; Yuji Awano, Tokyo, both of Japan

[73] Assignee: Fujitsu Limited, Kawasaki, Japan

[21] Appl. No.: 758,363

[22] Filed: Sep. 10, 1991

Related U.S. Application Data

[63] Continuation of Ser. No. 551,325, Jul. 12, 1990, abandoned.

[30] Foreign Application Priority Data

Jul. 12, 1989 [JP] Japan ................................. 1-178070

[51] Int. Cl.$^5$ .................... H01L 29/205; H01L 29/80
[52] U.S. Cl. .................................... 357/22; 357/4; 357/16
[58] Field of Search .......................... 357/16, 22, 4

[56] References Cited

FOREIGN PATENT DOCUMENTS

| | | | |
|---|---|---|---|
| 60-86872 | 5/1985 | Japan | 357/16 |
| 60-117677 | 6/1985 | Japan | 357/22 |
| 60-144979 | 7/1985 | Japan | 357/22 |
| 61-96770 | 5/1986 | Japan | 357/16 |
| 61-156773 | 7/1986 | Japan | 357/16 |
| 62-211964 | 9/1987 | Japan | 357/22 |
| 62-252975 | 11/1987 | Japan | 357/22 |
| 1-50570 | 2/1989 | Japan | 357/16 |

OTHER PUBLICATIONS

T. Ohori et al.; "Uniform and Abrupt InGaP/GaAs Selectively Doped Heterostructures Grown by MOVPE for HEMT ICs"; Nov. 1988; Journal of Crystal Growth, vol. 93, Nos. 1-4, pp. 905-910; Japan.

*Primary Examiner*—Jerome Jackson, Jr.
*Attorney, Agent, or Firm*—Staas & Halsey

[57] ABSTRACT

A semiconductor device having a selectively doped heterostructure comprises a substrate, a channel layer, a carrier supplying layer, and electrodes provided on the carrier supplying layer. The channel layer and the carrier supplying layer form a heterojunction interface at a boundary between the channel layer and the carrier supplying layer with a two-dimensional electron gas formed in the channel layer along the heterojunction interface. The carrier supplying layer and the channel layer have respective compositions determined such that the $\Gamma$ valley of the conduction band of the carrier supplying layer has an energetical level higher than a corresponding energetical level of the $\Gamma$ valley of the conduction band of the channel layer at the heterojunction interface, the L valley of the conduction band of the carrier supplying layer has an energetical level higher than a corresponding energetical level of the L valley of the conduction band of the channel layer at the heterojunction interface, the X valley of the conduction band of the carrier supplying layer has an energetical level higher than a corresponding energetical level of the X valley of the conduction band at the heterojunction interface, the energetical level of the $\Gamma$ valley of the conduction band of the carrier supplying layer is equal to or higher than the energetical level of the L valley of the conduction band of the channel layer at the heterojunction interface, and the energetical level of the L valley of the conduction band of the carrier supplying layer is equal to or higher than the energetical level of the X valley of the conduction band of the channel layer at the heterojunction interface.

4 Claims, 13 Drawing Sheets

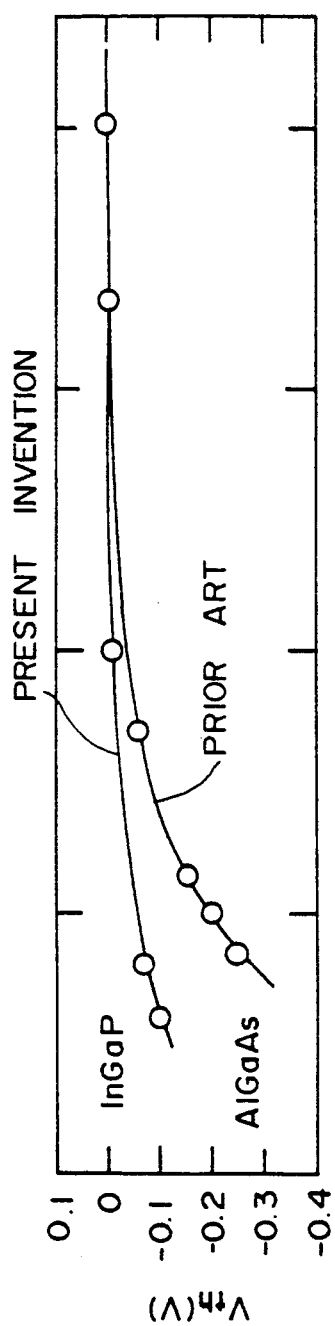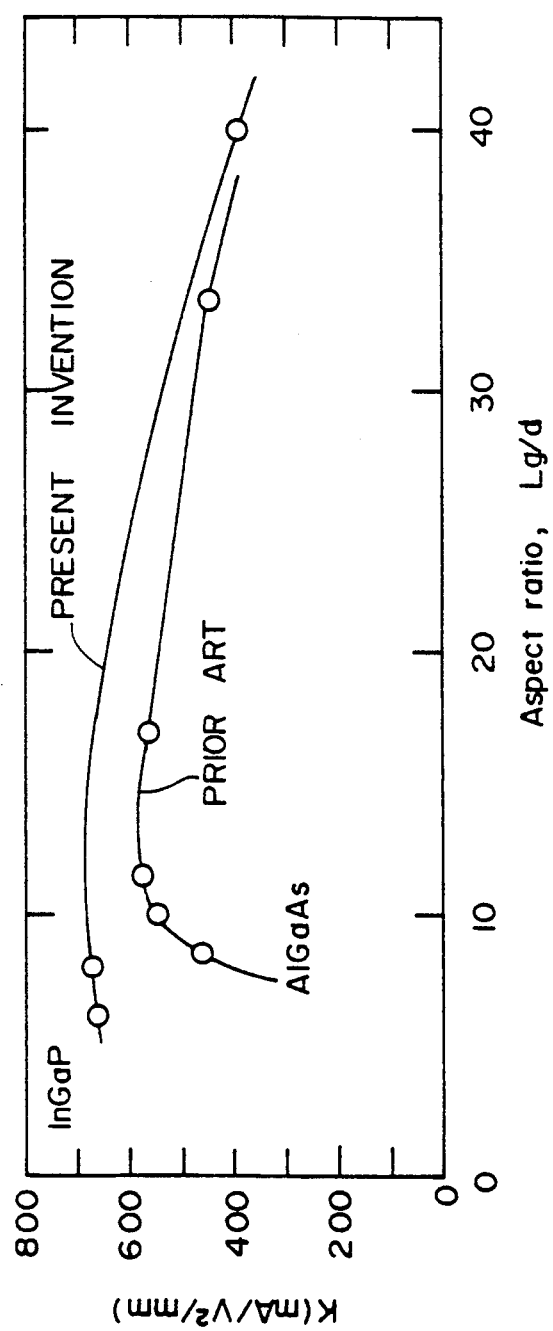
FIG. 9A
FIG. 9B

SEMICONDUCTOR DEVICE HAVING A SELECTIVELY DOPED HETEROSTRUCTURE

This application is a continuation of application Ser. No. 551.325, filed Jul. 12, 1990, now abandoned.

BACKGROUND OF THE INVENTION

The present invention generally relates to semiconductor devices and more particularly to an improvement of a semiconductor device having a selectively doped heterostructure such as the high electron mobility transistor (HEMT).

HEMT devices are now becoming available in the form of discrete devices or in the form of integrated circuits, similarly to the case of other, conventional semiconductor devices. As is well known, a typical HEMT device has a structure of the field effect transistor wherein a two-dimensional electron gas is formed at a heterojunction interface between an undoped channel layer of GaAs and a doped, carrier supplying layer of AlGaAs, and this two-dimensional electron gas is used as the medium for transporting the carriers at an enormously high speed.

With the spreading of use of the HEMT device in various fields, a number of specific problems are encountered. For example, there is a problem called "real space transfer" in which the electrons transported through the channel layer from the source region to the drain region of the HEMT device is accelerated excessively by the large electric field between the source and the drain regions. When such an acceleration occurs, the electrons invade into the carrier supplying layer, overriding the potential barrier formed at the heterojunction interface as a result of the increased energy. This phenomenon occurs most significantly in the region between the gate and the drain of the HEMT device in which the acceleration of the electrons becomes the maximum. Once the electrons enter into the carrier supplying layer, the electrons neutralize the positive space charges which are formed as a result of the formation of the two-dimensional electron gas. In other words, such an invasion of the electrons into the carrier supplying layer causes a vanishing of the two-dimensional electron gas which in turn causes a large voltage drop across the gate and the drain of the HEMT device. Thereby, the operational characteristic of the HEMT device is significantly deteriorated. In the conventional HEMT devices, the problem of the foregoing real space transfer of the electrons is difficult to eliminate. This problem becomes particularly serious when the gate length of the HEMT device is reduced for high speed operation and high integration density. In the description hereinafter, the problem of the real space transfer will be examined briefly.

FIG. 1 shows a typical example of the band diagram at 77K of the conventional selectively doped heterostructure wherein an n-type AlGaAs carrier supplying layer $L_{ES}$ having a composition of $Al_{0.3}Ga_{0.7}As$ is grown on an undoped GaAs active layer $L_{AV}$. In the drawing, the energy levels of the $\Gamma$ valley, the L valley and the X valley of the conduction band are designated respectively by Ec1, Ec2 and Ec3, wherein FIG. 1 shows the profile of Ec1, Ec2 and Ec3 taken along the thickness of the foregoing heterostructure of the layers $L_{AV}$ and $L_{ES}$. Further, the energy discontinuities appearing at the heterojunction interface in the profile of the $\Gamma$ valley, the L valley and the X valley are designated respectively by $\Delta E_{D1}$, $\Delta E_{D2}$ and $\Delta E_{D3}$. $W_T$ designates a "window of transition" to be described later.

In the foregoing selectively doped heterostructure, the energy discontinuities $\Delta E_{D1}$, $\Delta E_{D2}$ and $\Delta E_{D3}$ assume respectively the values of 0.21 eV, 0.04 eV and −0.07 eV. In this structure, although the energy discontinuity $\Delta E_{D1}$ takes a value sufficiently large to form the two-dimensional electron gas at the heterojunction interface, there is a tendency that the electrons, when excited to the L valley upon the acceleration in the channel layer $L_{AV}$, invade into the carrier supplying layer $L_{ES}$, overriding the small energy discontinuity $\Delta E_{D2}$ at the heterojunction interface. In other words, there occurs the problem of the real space transfer. Similarly, the electrons excited to the X valley can easily cause the real space transfer to the carrier supplying layer $L_{ES}$, as the energy level of the L or X valley of the conduction band of the carrier supplying layer $L_{ES}$ is lower than energy level of the X valley of the conduction band of the channel layer $L_{AV}$ by 0.07 eV.

A similar real space transfer occurs also between the L valley of the channel layer $L_{AV}$ and the $\Gamma$ valley of the carrier supplying layer $L_{ES}$. Most importantly, there is a tendency that the electrons, causing the transition from the $\Gamma$ valley to the L valley in the channel layer $L_{AV}$ in response to the intervalley scattering, cause the real space transfer to the $\Gamma$ valley of the carrier supplying layer $L_{ES}$ through the window of transition $W_T$ before they complete the transition to the L valley in the channel layer $L_{AV}$. This window $W_T$ is formed as a discontinuity between the L valley in the channel layer $L_{AV}$ and the $\Gamma$ valley in the carrier supplying layer $L_{ES}$ and has an energy difference of 0.05 eV. As the proportion of the electrons causing the transition to the energy level of the window $W_T$ in the channel layer $L_{AV}$ is much larger than the proportion of the electrons causing the transition to the L valley or X valley, the effect of the real space transfer of the electrons through the window $W_T$ is not negligible at all particularly when there is a large acceleration of electrons between the source and drain of the HEMT device associated with the decreased gate length.

Although there are proposed various material systems for the selectively doped structure of HEMT devices, the problem of the window of transition $W_T$ appearing in the band structure and the real space transfer of electrons occurring through the window $W_T$ has never been considered hitherto.

FIG. 2 shows the band diagram at 77K of a selectively doped heterostructure comprising an n-type carrier supplying layer $L_{ES}$ having a composition of $Ga_{0.516}In_{0.484}P$ and the channel layer $L_{AV}$ having a composition of GaAs. As can be seen clearly, there is a discontinuity between the L valley in the channel layer and the $\Gamma$ valley in the carrier supplying layer, forming the window of transition $W_T$ similarly to the case of FIG. 1. In this material system, the parameter $\Delta E_{D1}$ assumes a value of 0.22 eV, the parameter $\Delta E_{D2}$ assumes a value of 0.34 eV, and the parameter $\Delta E_{D3}$ assumes a value of 0.19 eV. Thereby, the window $W_T$ is formed in response to the energy discontinuity of 0.04 eV appearing between the L valley in the channel layer $L_{AV}$ and the $\Gamma$ valley in the carrier supplying layer $L_{ES}$ at the heterojunction interface. Thus, the HEMT device using the selectively doped heterostructure of FIG. 2 has the problem of the real space transfer of electrons similarly to the case of FIG. 1.

FIG. 3 shows another example of the band diagram of the selectively doped heterostructure wherein an n-type carrier supplying layer $L_{ES}$ having a composition of $Al_{0.52}In_{0.48}As$ is provided on an undoped channel layer $L_{AV}$ of $Ga_{0.53}In_{0.47}As$. In this structure, there appear energy discontinuities $\Delta E_{D1}$, $\Delta E_{D2}$ and $\Delta E_{D3}$ such that $\Delta E_{D1} = 0.5$ eV, $\Delta E_{D2} = 0.13$ eV and $\Delta E_{D3} = -0.03$ eV. In this case, a large potential barrier appears in the $\Gamma$ valley in association with the large, positive energy discontinuity $\Delta E_{D1}$. In the profile of the L valley, on the other hand, it will be understood that the energy level of the carrier supplying layer $L_{ES}$ at the heterojunction interface is higher only by 0.13 eV than the corresponding energy level of the channel layer $L_{AV}$. Furthermore, there appears the window of transition $W_T$, as the $\Gamma$ valley of the carrier supplying layer at the heterojunction interface is lower than the L valley of the channel layer by about 0.03 eV. Thus, the electrons are spatially transferred from the channel layer $L_{AV}$ to the carrier supplying layer $L_{ES}$ passing through the window of transition $W_T$. It should be noted that the electrons have a very high mobility in the $\Gamma$ valley of the channel layer $L_{AV}$ and are easily accelerated to an energy level sufficient to override the potential barrier $\Delta E_{D1}$. Further, it will be seen that there appears another window $W_T'$ between the L valley and the X valley in this structure and the electrons will cause the real space transfer through the window $W_T'$, when they are excited in response to the acceleration.

SUMMARY OF THE INVENTION

Accordingly, it is a general object of the present invention to provide a novel and useful semiconductor device having a selectively doped heterostructure wherein the foregoing problems are eliminated.

Another object of the present invention is to provide a semiconductor device having a selectively doped heterostructure wherein the occurrence of the real space transfer of the carriers is effectively suppressed.

Another object of the present invention is to provide a semiconductor device having a selectively doped heterostructure, comprising a channel layer of an undoped semiconductor material and carrier supplying layer of a doped semiconductor material provided on the channel layer for supplying carriers, said channel layer and said carrier supplying layer forming a heterojunction interface at a boundary between the channel layer and the carrier supplying layer, said doped semiconductor material forming the carrier supplying layer and said undoped semiconductor material forming the channel layer having respective compositions determined such that the $\Gamma$ valley of the conduction band of the carrier supplying layer has an energy level higher than a corresponding energy level of the $\Gamma$ valley of the conduction band of the channel layer at the heterojunction interface, the L valley of the conduction band of the carrier supplying layer has an energy level higher than a corresponding energy level of the L valley of the conduction band of the channel layer at the heterojunction interface, the X valley of the conduction band of the carrier supplying layer has an energy level higher than a corresponding energy level of the X valley of the conduction band at the heterojunction interface, the energy level of the $\Gamma$ valley of the conduction band of the carrier supplying layer is equal to or higher than the energy level of the L valley of the conduction band of the channel layer at the heterojunction interface, and the energy level of the L valley of the conduction band of the carrier supplying layer is equal to or higher than the energy level of the X valley of the conduction band of the channel layer at the heterojunction interface. According to the present invention, the real space transfer of electrons across the heterojunction interface is prevented or suppressed and the problem of the extinction of the two-dimensional electron gas at the heterojunction interface is eliminated.

Other objects and further features of the present invention will become apparent from the following detailed description when read in conjunction with the attached drawings.

BRIEF DESCRIPTION OF THE DRAWINGS

FIGS. 9A, 9B, 10 and 11 are diagrams showing the effect of the present invention.

DETAILED DESCRIPTION

Figure 4:
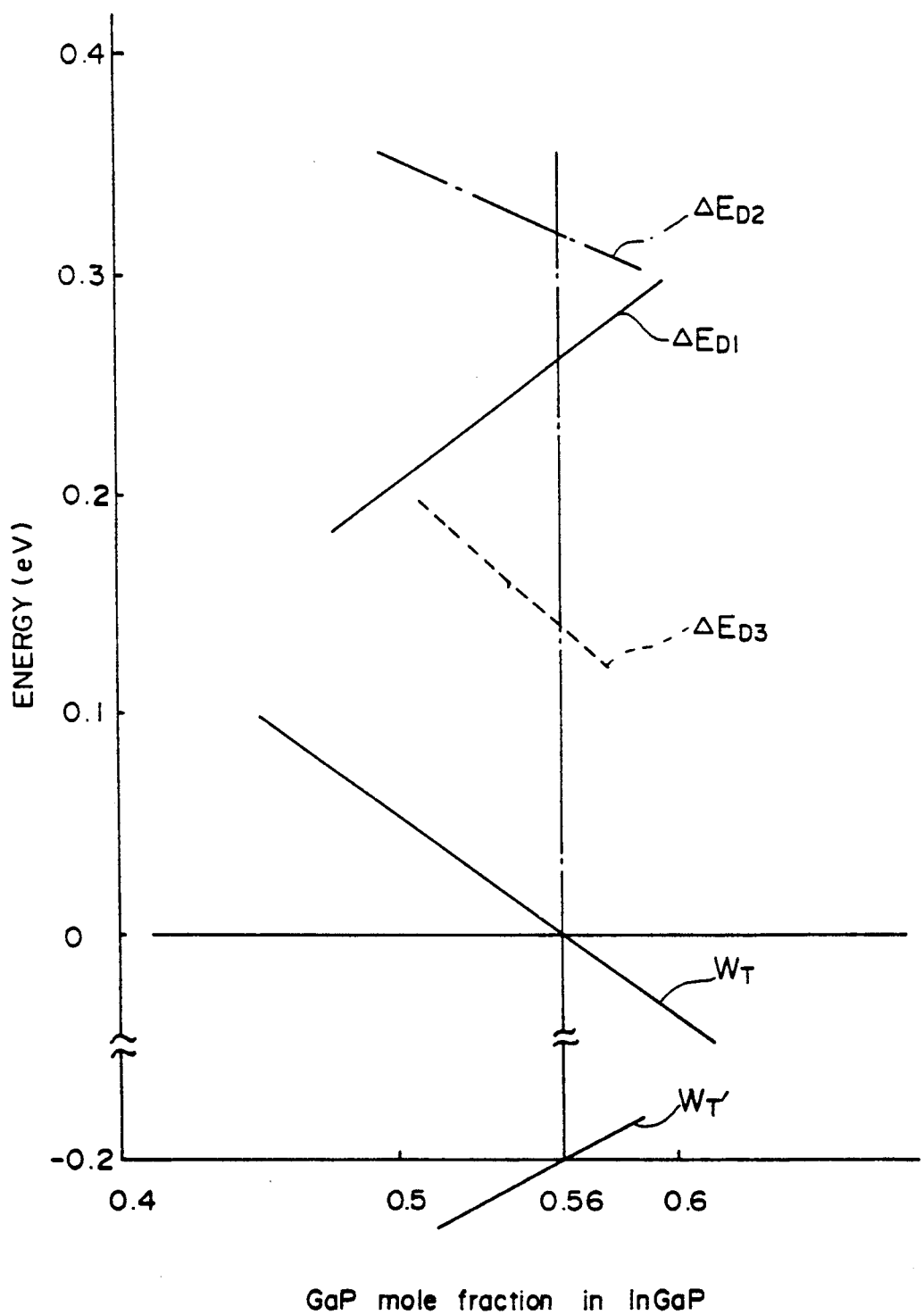
FIG. 4 is a graph for explaining the principle of the present invention in a first material system.

FIG. 4 shows the principle of the present invention wherein the change of the parameters $\Delta E_{D1}$, $\Delta E_{D2}$, $\Delta E_{D3}$ and $W_T$ as well as $W_T'$ is plotted against the composition of the carrier supplying layer $L_{ES}$. In this example, the carrier supplying layer $L_{ES}$ is made of $In_{1-x}Ga_xP$ doped to the n-type and the channel layer $L_{AV}$ is made of GaAs of the intrinsic type.

As can be seen from FIG. 4, all of the parameters $\Delta E_{D1}$, $\Delta E_{D2}$ and $\Delta E_{D3}$ assume positive values and change linearly, with the parameter x representing the mole fraction of Ga in the carrier supplying layer $L_{ES}$ in the compositional range of Ga between 0.4 and 0.6. Further, it should be noted that the parameter $W_T$ changes its sign from positive to negative at a composition of $In_{0.44}Ga_{0.56}P$ with increasing Ga content in the carrier supplying layer $L_{ES}$. Thereby, the window of transition $W_T$ is closed when the content of Ga in the carrier supplying layer $L_{ES}$ is chosen to be 0.56 or more with respect to In, and the real space transfer of the accelerated electrons through the window $W_T$ is effectively suppressed. In the foregoing compositional range, the parameter $W_T'$ is always negative and no window of transition appears between the L valley and the X valley.

Figure 5:
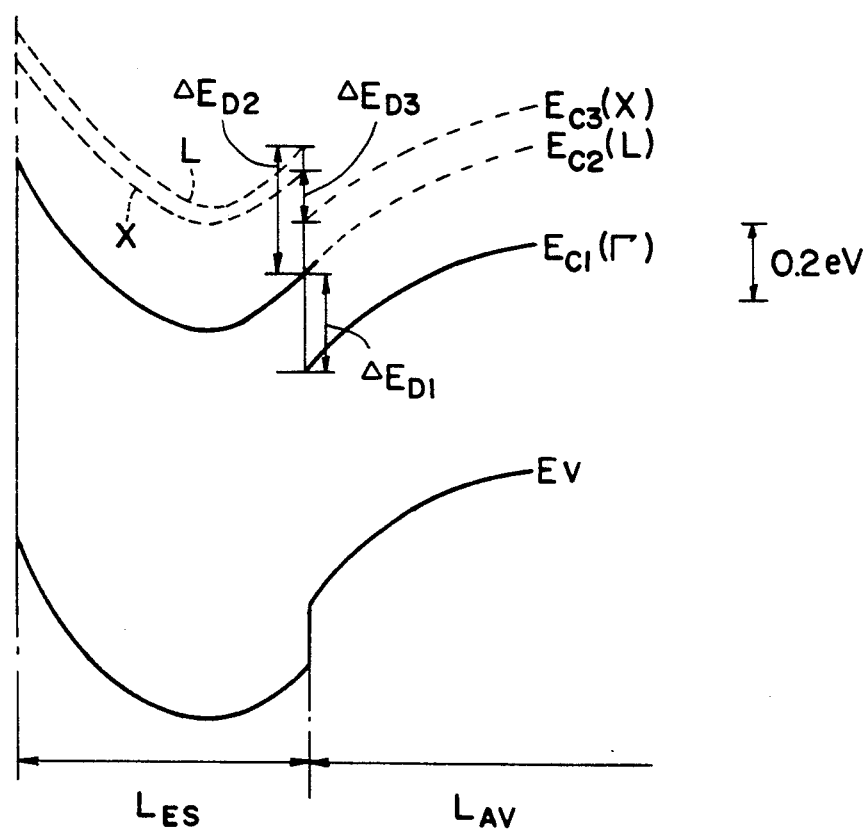
FIG. 5 is a band diagram showing an example of the selectively doped heterostructure used in the present invention and constructed on the basis of the first material system.

FIG. 5 shows the band diagram of the selectively doped heterostructure formed in correspondence to the material system of FIG. 4 wherein the carrier supplying layer $L_{ES}$ has the composition of $In_{0.44}Ga_{0.56}P$ and is grown on the channel layer $L_{AV}$ of undoped GaAs. As can be seen from this band diagram, the window $W_T$ has disappeared while still maintaining sufficient positive energy discontinuities $\Delta E_{D1}$, $\Delta E_{D2}$ and $\Delta E_{D3}$. Thereby, an effective confinement of the two-dimensional electron gas at the heterojunction interface can be achieved even when there occurs a significant acceleration of electrons in the channel layer $L_{AV}$. Using the foregoing composition of $In_{0.44}Ga_{0.56}P$ for the carrier supplying layer $L_{ES}$, a satisfactory lattice matching can be achieved between the carrier supplying layer $L_{ES}$ and the channel layer $L_{AV}$ forming the selectively doped heterostructure.

Figure 6:
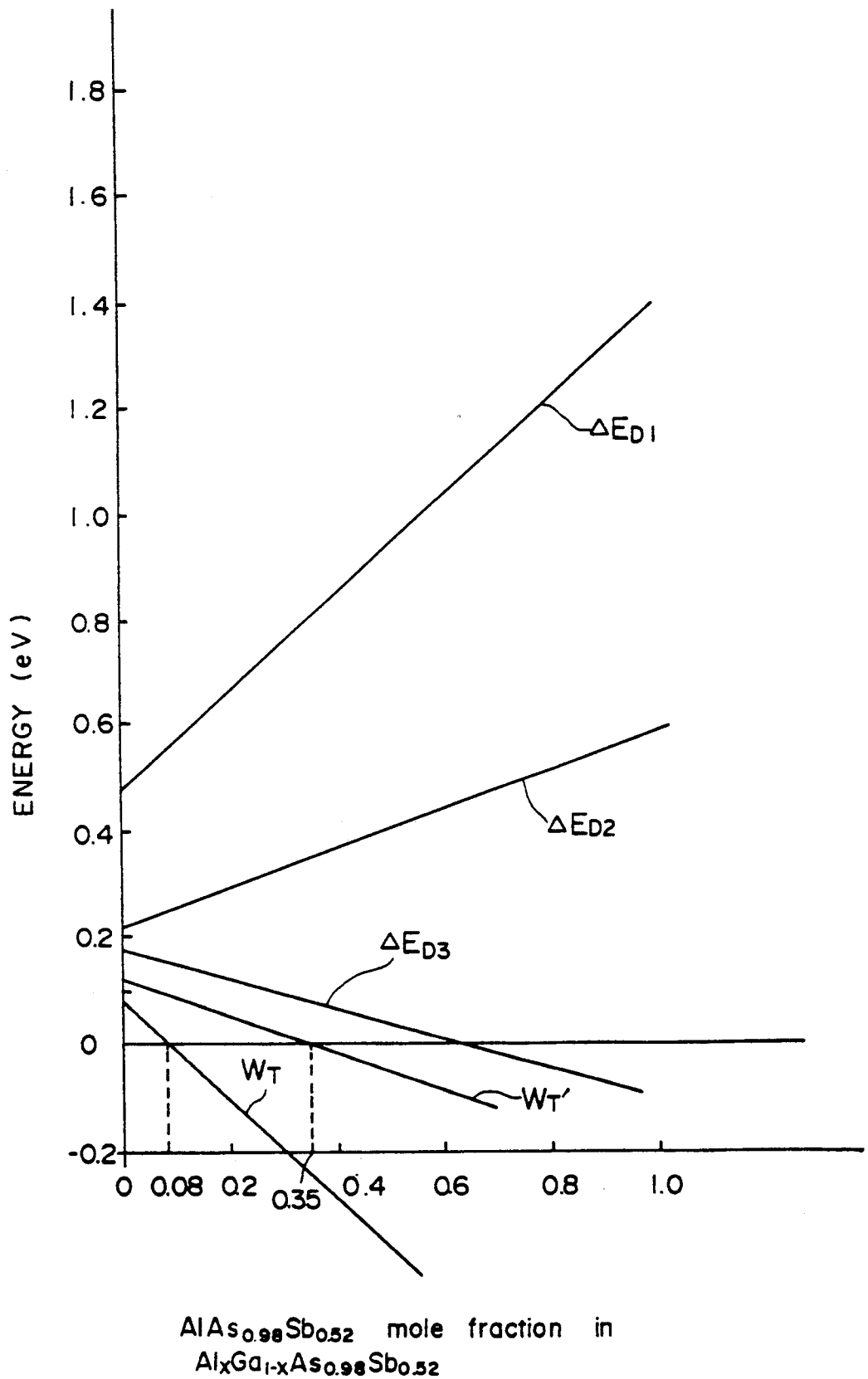
FIG. 6 is a graph for explaining the principle of the present invention in a second material system.

FIG. 6 is a diagram similar to FIG. 4 showing another example of the selectively doped heterostructure wherein the carrier supplying layer $L_{ES}$ has the composition of $Al_xGa_{1-x}As_{0.48}Sb_{0.52}$ and is grown on the undoped channel layer $L_{AV}$ of which composition is represented as $In_{0.53}Ga_{0.47}As$. By choosing the compositions of the layers as such, the matching of the crystal lattice between the carrier supplying layer and the undoped channel layer is satisfactorily established.

The drawing shows the change of the parameters $\Delta E_{D1}$, $\Delta E_{D2}$, $\Delta E_{D3}$ and $W_T$ as well as $W_{T'}$, as a function of the content of Al in the carrier supplying layer $L_{ES}$. In this case, the parameter $W_T$ becomes to be zero when the composition of the carrier supplying layer $L_{ES}$ is set to be $Al_{0.08}Ga_{0.92}As_{0.48}Sb_{0.52}$. In other words, the window $W_T$ is closed when the Al content in the carrier supplying layer $L_{ES}$ is chosen to be equal to or larger than 0.08 while still securing sufficient energy discontinuities $\Delta E_{D1}$, $\Delta E_{D2}$ and $\Delta E_{D3}$ for the carrier confinement at the heterojunction interface.

In this composition, it should be noted that there still exists the positive window $W_{T'}$ between the X valley and the L valley. The windows $W_T$ and $W_{T'}$ are closed when the Al content in the carrier supplying layer $L_{ES}$ is chosen to be equal to or larger than 0.35.

Figure 7:
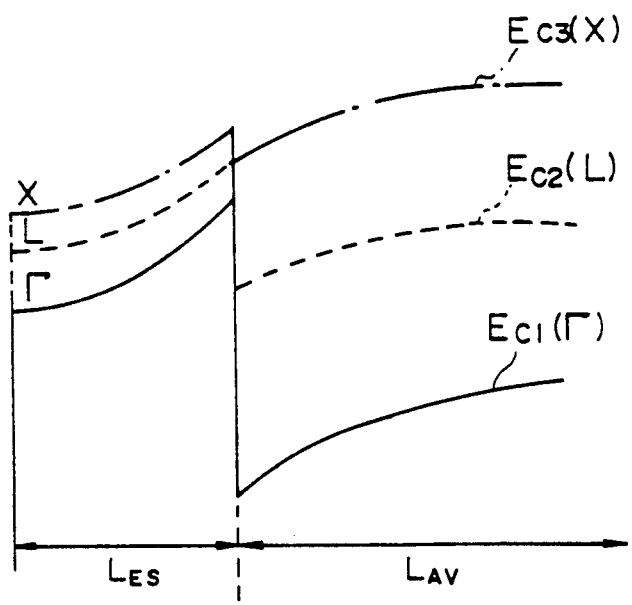
FIG. 7 is a band diagram showing another example of the selectively doped heterostructure used in the present invention and constructed on the basis of the second material system.

FIG. 7 shows the band diagram of the selectively doped heterostructure wherein the carrier supplying layer $L_{ES}$ has the composition of $Al_{0.35}Ga_{0.65}As_{0.48}Sb_{0.52}$ and the channel layer $L_{AV}$ has the composition of $In_{0.53}Ga_{0.47}As$. As will be clearly understood from this band diagram, the windows $W_T$ or $W_{T'}$ is completely disappeared and there occurs an efficient formation of the two-dimensional electron gas at the heterojunction interface even when there is a significant acceleration of electrons in the channel layer $L_{AV}$.

Next, the semiconductor device having a selectively doped heterostructure according to a first embodiment of the present invention will be described with reference to FIGS. 8A–8E.

Figure 8A:
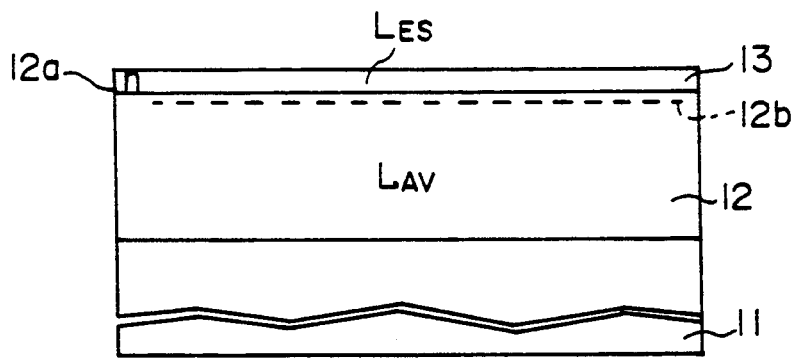
FIGS. 8A–8E are diagrams showing various steps for fabricating a semiconductor device according to a first embodiment of the present invention.

Referring to the drawings, in a first step of FIG. 8A, a selectively doped heterostructure including a substrate 11 of semi-insulating GaAs, a channel layer 12 of undoped GaAs and a carrier supplying layer of n-type GaInP is formed by consecutively depositing GaAs on the substrate 11 as the channel layer 12 by the MOCVD process with a thickness of 6000 Å using a mixture of trimethylgallium (TMG: $(CH_3)_3Ga$) and arsine ($AsH_3$), and GaInP on the channel layer 12 by the MOCVD process as the carrier supplying layer 13 with a thickness of 300 Å using a mixture of TMG, trimethylindium (TMI: $(CH_3)_3In$) and phosphine ($PH_3$) admixed further with monosilane ($SiH_4$) Thereby, the carrier supplying layer 13 is doped by Si with an impurity concentration of $1.5 \times 10^{18}$ cm$^{-3}$. Thereby, a heterojunction interface 12a is formed at the boundary between the channel layer 12 and the carrier supplying layer 13 and there is formed a two-dimensional electron gas 12b in the channel layer 12 along the heterojunction interface 12a as is well known in the art.

It should be noted that the composition of the carrier supplying layer 13 is determined so that the layer 13 contains Ga with a mole fraction of more than 0.56. Thereby, a band diagram substantially identical to that shown in FIG. 5 is obtained. It should be noted that, by choosing the composition of the carrier supplying layer 13 as such, the energy discontinuity $\Delta E_{D1}$, $\Delta E_{D2}$ and $\Delta E_{D3}$ respectively have values of 0.26 eV, 0.32 eV and 0.14 eV, and the window of transition $W_T$ becomes to be zero. Further, the other window of transition $W_{T'}$ has a negative value as already explained with reference to FIG. 4. Thus, there occurs no substantial real space transfer of electrons even when the electrons in the two-dimensional electron gas at the heterojunction interface between the layer 12 and the layer 13 is accelerated.

Next, in a step of FIG. 8B, a photoresist 14 is applied on the top surface of the carrier supplying layer 13 and patterned subsequently so as to expose a part of the carrier supplying layer 14A in correspondence to source and drain electrodes to be provided on the layer 13.

Figure 8B:
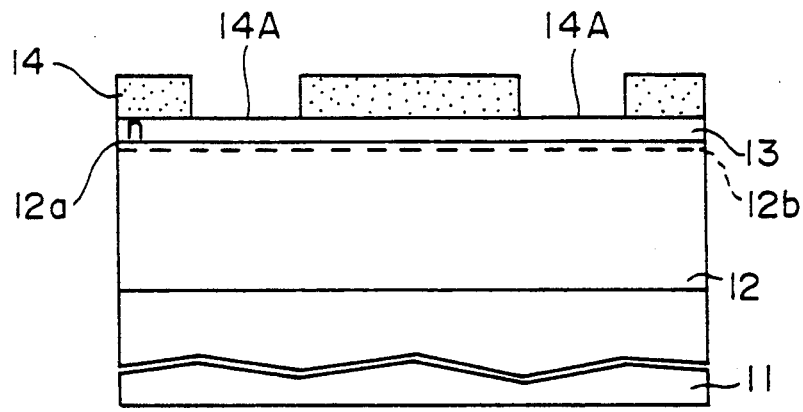
Figure 8C:
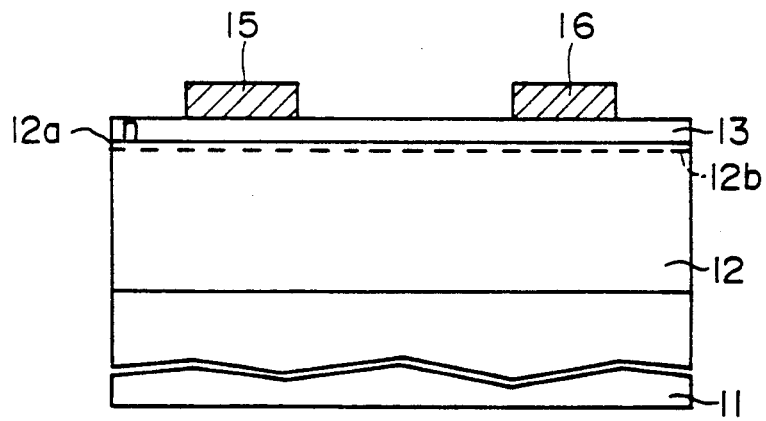

Next, in a step of FIG. 8C, a gold-germanium alloy film and a gold film are deposited consecutively on the structure of FIG. 8B respectively with a thickness of 5000 Å and 3000 Å by a vacuum deposition process, and a structure shown in FIG. 8C having a source electrode 15 and a drain electrode 16 is obtained after a removal of the photoresist 14 by dipping into acetone or other suitable solvent. The structure thus obtained is annealed in a nitrogen atmosphere at 450° C. for 5 minutes as usual such that the gold-germanium layer and the gold layer form an alloyed structure which establishes an excellent ohmic contact with the underlying carrier supplying layer 13.

Figure 8D:
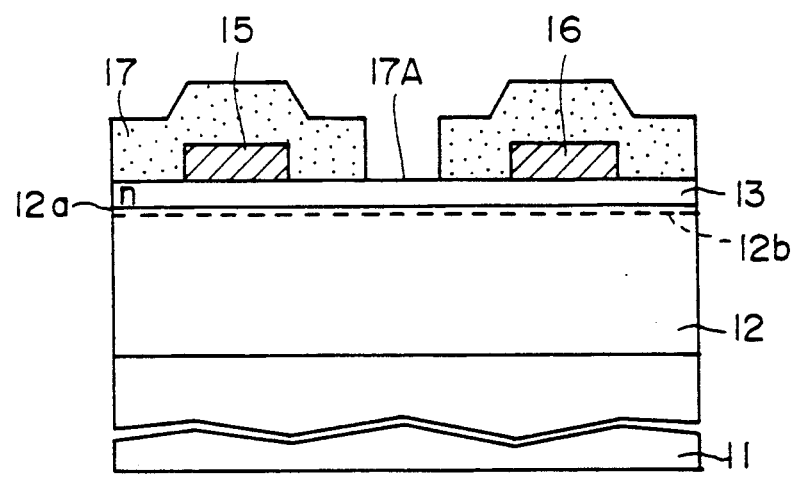

Next, in a step of FIG. 8D, a photoresist 17 is applied on the structure of FIG. 8C and patterned subsequently to expose a part 17A of the carrier supplying layer 13 on which the gate structure is to be provided. Further, in a step of FIG. 8E, an aluminum layer is deposited on the structure of FIG. 8D with a thickness of about 3000 Å, and the photoresist 17 is removed by dipping into acetone or other suitable solvent. Thereby, a HEMT device having a Schottky electrode 18 of patterned aluminum acting as the gate between the source and drain electrodes 15 and 16 is obtained as shown in FIG. 8E.

Figure 8E:
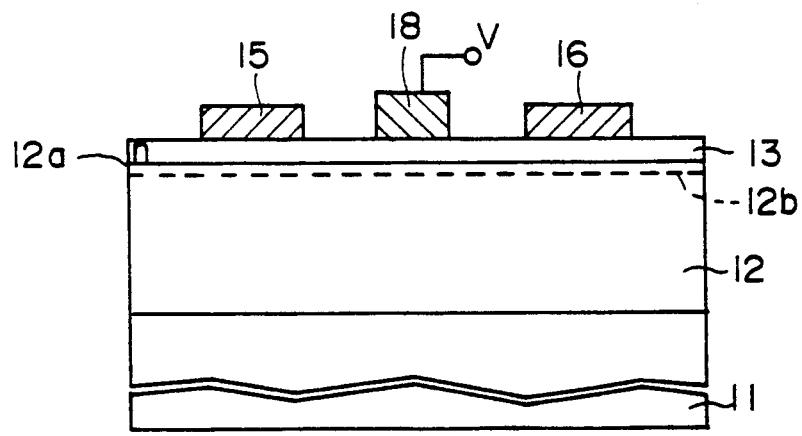

In the device of FIG. 8E, the carriers are injected into the two-dimensional electron gas 12b from the source electrode 15 through the carrier supplying layer 13 and are collected after passing through the two-dimensional electron gas 12b and flowing through the carrier supplying layer 13 by the drain electrode 16. The passage of the carriers from the source electrode 15 to the drain electrode 16 is controlled by a control voltage V applied to the Schottky electrode 18.

Figure 1:
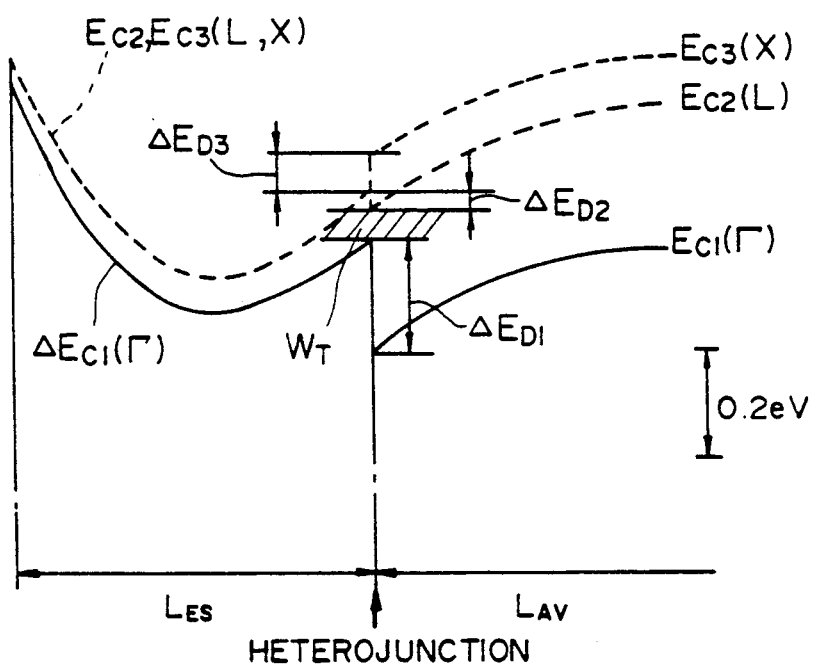
FIG. 1 is a band diagram showing a prior art semiconductor device having a selectively doped heterostructure.
Figure 2:
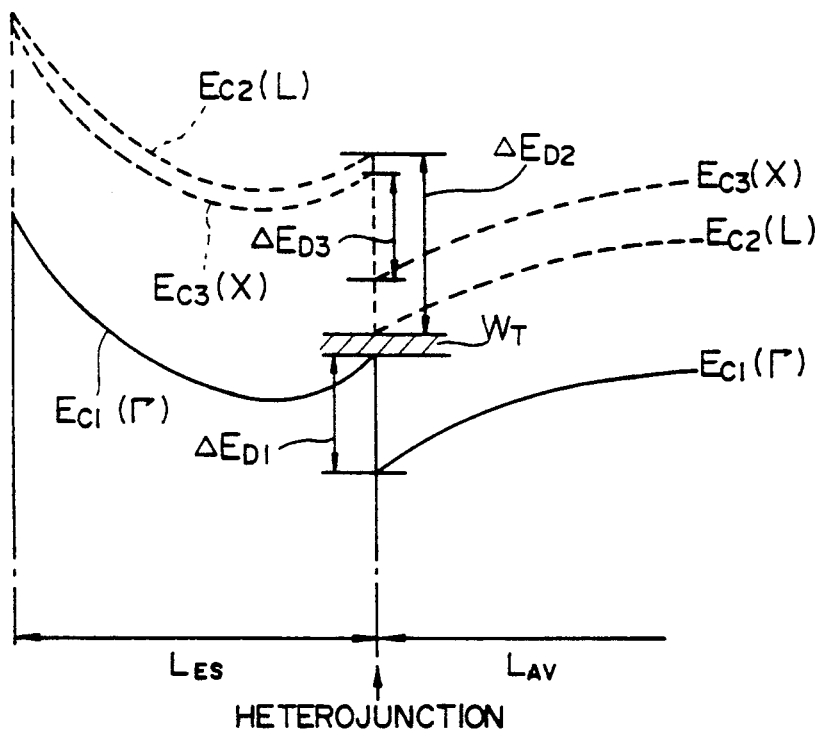
FIG. 2 is a band diagram showing another prior art semiconductor device having another selectively doped heterostructure.
Figure 3:
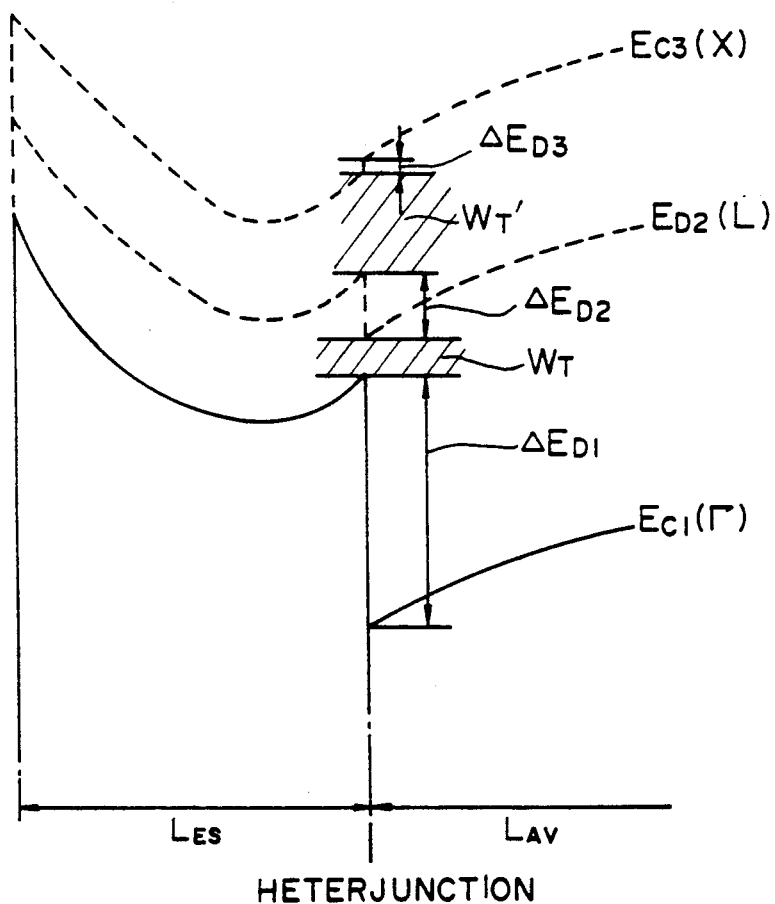
FIG. 3 is a band diagram showing still another prior art semiconductor device having still another selectively doped heterostructure.

Table I shows the transconductance $g_m$ of various HEMT devices including the HEMT device of FIG. 8E. In Table I, all the devices have a same gate length of 1.2 μm. It should be noted that the first HEMT device in Table I has the band structure of FIG. 1, the second HEMT device has the band structure of FIG. 2, while the last HEMT device in the Table I corresponds to the device of FIG. 8E and has the band structure of FIG. 5.

TABLE I

| type of heterostructure | gm |
|---|---|
| $Al_{0.3}Ga_{0.7}As/GaAs$ | 250 |
| $Ga_{0.516}In_{0.484}P/GaAs$ | 300 |
| $Ga_{0.56}In_{0.44}P/GaAs$ | 330 |

From this table, it is clear that there is achieved an improvement of the transconductance $g_m$ of about 10% by the present invention as compared to the case where the selectively doped heterostructure having the carrier supplying layer of $Ga_{0.516}In_{0.484}P$ is used. It should be noted that the transconductance of the HEMT device having the selectively doped heterostructure of $Ga_{0.516}In_{0.484}P/GaAs$ is already larger than that of the device having the selectively doped heterostructure of $Al_{0.3}Ga_{0.7}As/GaAs$ by 20%.

FIGS. 9A and 9B show the improvement of the characteristic of the HEMT device achieved by the present invention in comparison with the conventional device using the selectively doped heterostructure of $Al_{0.3}Ga_{0.7}As/GaAs$ as a function of the aspect ratio which is defined as the gate length Lg divided by the thickness d of the carrier supplying layer 13.

Referring to FIG. 9A showing the change of the threshold voltage Vth of the HEMT device, it will be seen that the change of Vth is very small and less than $-0.1$ volts even when the aspect ratio Lg/d is reduced to about 6–7. When the thickness d of the carrier supplying layer 13 is set to be 300 Å, the value of Lg corresponding to the foregoing aspect ratio is about 0.18–0.21 μm. In the case of the conventional device, on the other hand, there appears a significant decrease of Vth of more than $-0.3$ volts at the same gate length. Such a decrease of the threshold voltage with the decreasing gate length indicates that the control of the carriers flowing under the gate region of the HEMT device is lost and the carriers are caused to flow from the source region to the drain region through the carrier supplying layer and the substrate, thus causing the short channel effect.

FIG. 9B shows the change of the K-factor of the HEMT device as a function of the aspect ration Lg/d. It should be noted that the K-factor represents the ratio of the drift velocity of carriers over the saturated velocity. From FIG. 9B, it can be seen that there is a gradual increase of the K-factor with decreasing aspect ratio Lg/d in the case of the HEMT device of the present invention while there is a significant drop of the K-factor in the conventional device when the aspect ratio is decreased below about 10.

Figure 10:
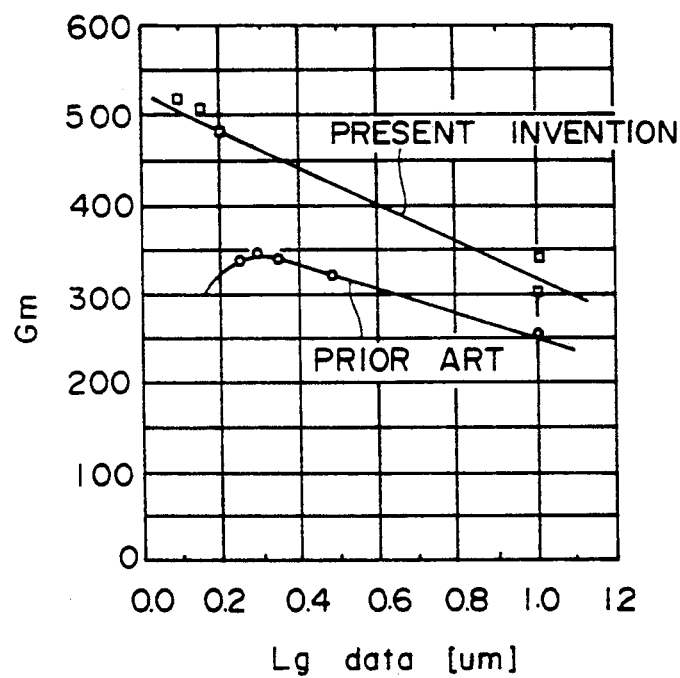

FIG. 10 shows the change of the transconductance $g_m$ as a function of the gate length Lg achieved by the embodiment of the present invention in comparison with the conventional device using the selectively doped heterostructure of $Al_{0.3}Ga_{0.7}As/GaAs$. In this diagram, too, there can be seen a steady increase of the parameter $g_m$ with decreasing gate length Lg in the case of the HEMT device of the present invention even when the gate length Lg is decreased to about 0.1 μm, while in the case of the conventional device, the parameter $g_m$ starts to decrease when the gate length Lg is decreased to below about 0.3 μm.

Figure 11:
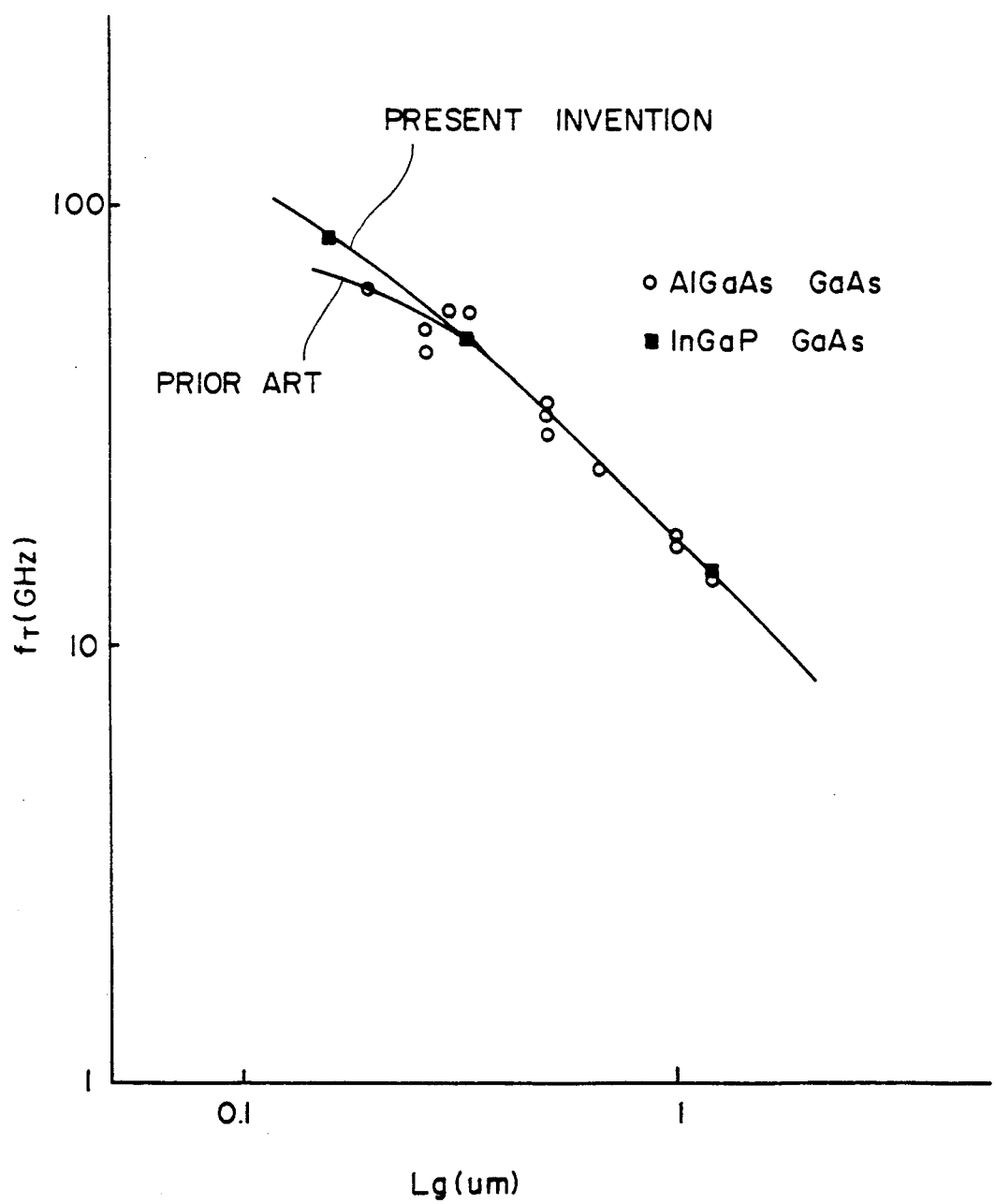

FIG. 11 shows the change of the cutoff frequency $f_T$ of the HEMT device of the present embodiment as a function of the gate length Lg. In the drawing, the cutoff frequency $f_T$ of the conventional HEMT device having the selectively doped heterostructure of $Al_{0.3}Ga_{0.7}As/GaAs$ is plotted also. As can be seen from FIG. 11, the cutoff frequency $f_T$ of the HEMT device of the present embodiment has a value which is substantially larger than that of the conventional HEMT device particularly in the range of the gate length Lg below about 0.3 μm.

From the foregoing, it is clearly demonstrated that the HEMT device of the present embodiment has a superior characteristic to the conventional HEMT devices particularly when the gate length Lg is decreased to the submicron orders. Thus, the HEMT device of the present invention is particularly suited for the super-high speed integrated circuits having a super-high integration density.

Further, the material for the carrier supplying layer 13 is not limited to InGaP with the composition of $In_{0.44}Ga_{0.56}P$ but other compositions $In_{1-x}Ga_xP$ with the compositional parameter x exceeding 0.56 may be employed. Furthermore, the material for the carrier supplying layer 13 is not limited to the material system if InGaP but the material system of $Al_xGa_{1-x}As_{0.48}Sb_{0.52}$ with the compositional parameter x equal to or larger than 0.08, preferably larger than 0.35 may be employed (FIG. 6).

Figure 12:
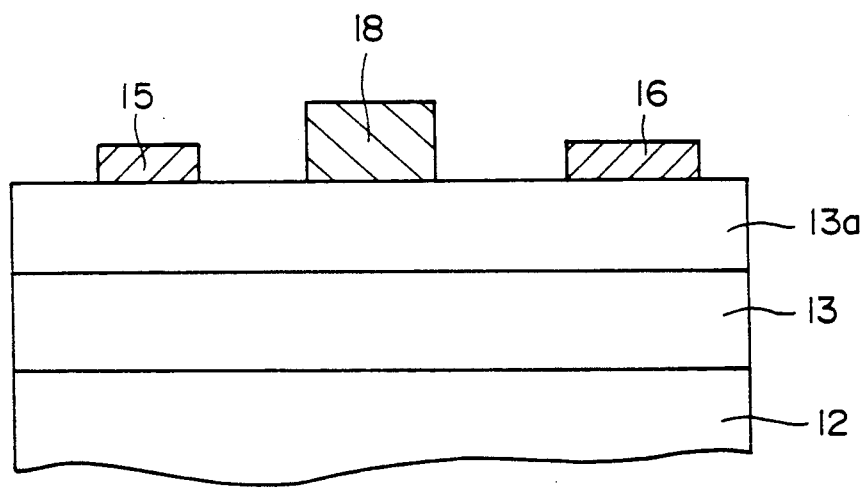
FIG. 12 is a diagram showing a second embodiment of the present invention.

Next, a second embodiment of the present invention will be described with reference to FIG. 12. In FIG. 12, the parts corresponding to those already described with the preceding drawings are given identical reference numerals and the description thereof will be omitted.

Referring to FIG. 12 showing only a part of the HEMT device, there is provided a second carrier supplying layer 13a having a composition of $In_{0.484}Ga_{0.516}P$ on the carrier supplying layer 13 which has the composition of $In_{1-x}Ga_xP$ with the compositional parameter x set to be equal to or larger than 0.56. In this composition of the second carrier supplying layer 13a, an excellent matching of lattice is achieved between the channel layer 12 and the layer 13a, and because of this, the carrier supplying layer 13 can have the compositional parameter x much larger than 0.56 as long as the thickness of the layer 13 is limited to be below about 50 Å. In the present embodiment, the preferred thickness of the layer 13 is 50 Å and the preferred thickness of the layer 13a is 250 Å.

Further, the present invention is not limited to the foregoing embodiments described heretofore but various variations and modifications may be made without departing from the scope of the invention.

What is claimed is:

1. A semiconductor device having a selectively doped heterostructure, comprising:
   a semiconductor substrate having a top surface;
   a channel layer of an undoped semiconductor material having a top surface, being provided on the top surface of the semiconductor substrate;
   a carrier supplying layer of a doped semiconductor material having a top surface, being provided on the top surface of the channel layer for supplying carriers, said channel layer and said carrier supplying layer forming a heterojunction interface at a boundary between the channel layer and the carrier supplying layer with a two-dimensional electron gas formed in the channel layer along the heterojunction interface;

said doped semiconductor material forming the carrier supplying layer and said undoped semiconductor material forming the channel layer having respective compositions determined such that the $\Gamma$ valley of the conduction band of the carrier supplying layer has an energy level higher than a corresponding energy level of the $\Gamma$ valley of the conduction band of the channel layer at the heterojunction interface, the L valley of the conduction band of the carrier supplying layer has an energy level higher than corresponding energy level of the L valley of the conduction band of the channel layer at the heterojunction interface, the X valley of the conduction band of the carrier supplying layer has an energy level higher than a corresponding energy level of the X valley of the conduction band at the heterojunction interface, the energy level of the $\Gamma$ valley of the conduction band of the carrier supplying layer is equal to or higher than the energy level of the L valley of the conduction band of the channel layer at the heterojunction interface, and the energy level of the L valley of the conduction band of the carrier supplying is equal to of higher than the energy level of the X valley of the conduction band of the channel layer at the heterojunction interface;

a first electrode provided on the top surface of the carrier supplying layer for injecting carriers into the two-dimensional electron gas through the carrier supplying layer;

a second electrode provided on the top surface of the carrier supplying layer with a separation from the first electrode, for collecting the carriers injected through the first electrode which flow through the two-dimensional electron gas to the second electrode; and control electrode means provided on the top surface of the carrier supplying layer between the first electrode and the second electrode, for controlling a flow of the carriers injected through the first electrode means which flow through the two-dimensional electron gas, said doped semiconductor material forming the carrier supplying layer comprising gallium indium phosphide having a composition represented as $In_{0.44}Ga_{0.56}P$ and the channel layer comprising gallium arsenide.

2. A semiconductor device having a selectively doped heterostructure, comprising:

a semiconductor substrate having a top surface;

a channel layer of an undoped semiconductor material having a top surface, being provided on the top surface of the semiconductor substrate;

a carrier supplying layer of a doped semiconductor material having a top surface, being provided on the top surface of the channel layer for supplying carriers, said channel layer and said carrier supplying layer forming a heterojunction interface at a boundary between the channel layer and the carrier supplying layer with a two-dimensional electron gas formed in the channel layer along the heterojunction interface;

said doped semiconductor material forming the carrier supplying layer and said undoped semiconductor material forming the channel layer having respective compositions determined such that the $\Gamma$ valley of the conduction band of the carrier supplying layer has an energy level higher than a corresponding energy level of the $\Gamma$ valley of the conduction band of the channel layer at the heterojunction interface, the L valley of the conduction band of the carrier supplying layer has an energy level higher than a corresponding energy level of the L valley of the conduction band of the channel layer at the heterojunction interface, the X valley of the conduction band of the carrier supplying layer has an energy level higher than a corresponding energy level of the X valley of the conduction band at the heterojunction interface, the energy level of the $\Gamma$ valley of the conduction band of the carrier supplying layer is equal to or higher than the energy level of the L valley of the conduction band of the channel layer at the heterojunction interface, and the energy level of the L valley of the conduction band of the carrier supplying layer is equal to or higher than the energy level of the X valley of the conduction band of the channel layer at the heterojunction interface;

a first electrode provided on the top surface of the carrier supplying layer for injecting carriers into the two-dimensional electron gas through the carrier supplying layer;

a second electrode provided on the top surface of the carrier supplying layer with a separation from the first electrode for collecting the carriers injected through the first electrode which flow through the two-dimensional electron gas to the second electrode; and control electrode means provided on the top surface of the carrier supplying layer between the first electrode and the second electrode for controlling a flow of the carriers injected through the first electrode means which flow through the two-dimensional electron gas.

said carrier supplying layer comprising a first layer of said doped semiconductor material and a second layer grown on said first layer, said second layer having a composition so determined as to establish a matching of a crystal lattice of the carrier supplying layer and a crystal lattice of the channel layer.

3. A semiconductor device as claimed in claim 2, wherein said second layer has a composition of $In_{0.484}Ga_{0.516}P$.

4. A semiconductor device having a selectively doped heterostructure, comprising:

a semiconductor substrate having a top surface;

a channel layer of an undoped semiconductor material having a top surface, being provided on the top surface of the semiconductor substrate;

a carrier supplying layer of a doped semiconductor material having a top surface, being provided on the top surface of the channel layer for supplying carriers, said channel layer and said carrier supplying layer forming a heterojunction interface at a boundary between the channel layer and the carrier supplying layer with a two-dimensional electron gas formed in the channel layer along the heterojunction interface;

said doped semiconductor material forming the carrier supplying layer and said undoped semiconductor material forming the channel layer having respective compositions determined such that the $\Gamma$ valley of the conduction band of the carrier supplying layer has an energy level higher than a corresponding energy level of the $\Gamma$ valley of the conduction band of the channel layer at the heterojunction interface, the L valley of the conduction band of the carrier supplying layer has an energy level higher than a corresponding energy level of the L valley of the conduction band of the channel layer at the heterojunction interface, the X valley of the conduction band of the carrier supplying layer has an energy level higher than a corresponding energy level of the X valley of the conduction band at the heterojunction interface, the energy level of the $\Gamma$ valley of the conduction band of the carrier supplying layer is equal to or higher than the energy level of the L valley of the conduction band of the channel layer at the heterojunction interface, and the energy level of the L valley of the conduction band of the carrier supplying layer is equal to or higher than the energy level of the X valley of the conduction band of the channel layer at the heterojunction interface;

a first electrode provided on the top surface of the carrier supplying layer for injecting carriers into the two-dimensional electron gas through the carrier supplying layer;

a second electrode provided on the top surface of the carrier supplying layer with a separation from the first electrode, for collecting the carriers injected through the first electrode which flow through the two-dimensional electron gas to the second electrode; and control electrode means provided on the top surface of the carrier supplying layer between the first electrode and the second electrode, for controlling a flow of the carriers injected through the first electrode means which flow through the two-dimensional electron gas.

said doped semiconductor material forming the carrier supplying layer comprises aluminum gallium arsenide antimonide having a composition of $Al_xGa_{1-x}As_{0.48}Sb_{0.52}$ with a compositional parameter X chosen to be equal to or larger than 0.35 and the channel layer comprising $Ga_{0.53}In_{0.47}As$ which is lattice-matched to indium phosphide.

* * * * *